(12) United States Patent
Pokrass

(10) Patent No.: US 11,167,499 B2
(45) Date of Patent: Nov. 9, 2021

(54) CLEANING COMPOSITION

(71) Applicant: Stratasys Ltd., Rehovot (IL)

(72) Inventor: Mariana Pokrass, Rehovot (IL)

(73) Assignee: Stratasys Ltd., Rehovot (IL)

( * ) Notice: Subject to any disclaimer, the term of this patent is extended or adjusted under 35 U.S.C. 154(b) by 487 days.

(21) Appl. No.: 15/752,300

(22) PCT Filed: Aug. 14, 2016

(86) PCT No.: PCT/IL2016/050887
§ 371 (c)(1),
(2) Date: Feb. 13, 2018

(87) PCT Pub. No.: WO2017/029658
PCT Pub. Date: Feb. 23, 2017

(65) Prior Publication Data
US 2018/0236717 A1 Aug. 23, 2018

Related U.S. Application Data

(60) Provisional application No. 62/205,009, filed on Aug. 14, 2015, provisional application No. 62/205,010, filed on Aug. 14, 2015.

(51) Int. Cl.
*C11D 3/02* (2006.01)
*C11D 3/08* (2006.01)
(Continued)

(52) U.S. Cl.
CPC ............ *B29C 64/40* (2017.08); *B29C 64/112* (2017.08); *B29C 64/35* (2017.08); *B33Y 10/00* (2014.12);
(Continued)

(58) Field of Classification Search
CPC .. C11D 3/044; C11D 3/08; C11D 7/06; C11D 7/14
(Continued)

(56) References Cited

U.S. PATENT DOCUMENTS 2,303,398 A * 12/1942 Schwartz ................... 510/255
3,870,560 A * 3/1975 Shumaker ............ C23G 1/14
134/2
(Continued)

FOREIGN PATENT DOCUMENTS

CN 1347363 5/2002
CN 101027170 8/2007
(Continued)

OTHER PUBLICATIONS

Supplementary Partial European Search and the European Provisional Opinion dated Feb. 5, 2019 From the European Patent Office Re. Application No. 16836744.9. (15 Pages).
(Continued)

*Primary Examiner* — Gregory R Delcotto

(57) ABSTRACT

Novel cleaning compositions, usable for removing a cured support material from a printed object obtained by additive manufacturing such as 3D inkjet printing are provided. The cleaning compositions are aqueous alkaline compositions containing a combination of two alkaline substances: an alkali metal hydroxide and an alkali metal silicate, each at a concentration of no more than 3 weight percents of the total weight of the composition. The cleaning compositions are characterized by high and constant dissolution rate, and are particularly useful for removing a cured support material that includes cross-linked polymeric chains such as cross-linked polyacrylate chains. Kits comprising the alkaline substances, and methods of fabricating a three-dimensional model object which utilize the cleaning compositions or the kits, and a three-dimensional model object fabricated thereby, are also provided.

16 Claims, 1 Drawing Sheet

(51) Int. Cl.

| | | |
|---|---|---|
| *C11D 7/06* | (2006.01) | |
| *C11D 7/14* | (2006.01) | |
| *B29C 64/40* | (2017.01) | |
| *B33Y 70/00* | (2020.01) | |
| *B29C 64/112* | (2017.01) | |
| *G03G 9/087* | (2006.01) | |
| *C08F 283/06* | (2006.01) | |
| *C08F 220/28* | (2006.01) | |
| *C11D 3/04* | (2006.01) | |
| *C08F 2/48* | (2006.01) | |
| *B33Y 10/00* | (2015.01) | |
| *B33Y 40/00* | (2020.01) | |
| *B29C 64/35* | (2017.01) | |
| *B29C 35/08* | (2006.01) | |
| *G03F 7/00* | (2006.01) | |
| *G03F 7/027* | (2006.01) | |
| *B33Y 80/00* | (2015.01) | |
| *B29K 33/04* | (2006.01) | |

(52) U.S. Cl.
CPC ............... *B33Y 40/00* (2014.12); *B33Y 70/00* (2014.12); *C08F 2/48* (2013.01); *C08F 220/28* (2013.01); *C08F 283/06* (2013.01); *C11D 3/044* (2013.01); *C11D 3/08* (2013.01); *C11D 7/06* (2013.01); *C11D 7/14* (2013.01); *G03G 9/08722* (2013.01); *G03G 9/08728* (2013.01); *G03G 9/08793* (2013.01); *G03G 9/08795* (2013.01); *B29C 35/08* (2013.01); *B29K 2033/04* (2013.01); *B33Y 80/00* (2014.12); *G03F 7/0037* (2013.01); *G03F 7/027* (2013.01)

(58) Field of Classification Search
USPC ....... 510/165, 166, 167, 169, 170, 175, 435, 510/511
See application file for complete search history.

(56) References Cited

U.S. PATENT DOCUMENTS

| | | | | |
|---|---|---|---|---|
| 4,048,121 A * | 9/1977 | Chang | ................ | C11D 1/8255 510/245 |
| 4,093,566 A * | 6/1978 | MacNamara | .......... | C11D 3/044 510/245 |
| 4,259,434 A | 3/1981 | Yamasue et al. | | |
| 4,457,322 A * | 7/1984 | Rubin | ...................... | C23G 1/22 134/2 |
| 4,751,023 A * | 6/1988 | Stehlin | ................... | C11D 3/361 252/186.41 |
| 5,234,505 A * | 8/1993 | Winston | ................... | C11D 3/08 134/2 |
| 5,378,242 A * | 1/1995 | Christie | ................... | C11D 7/04 510/303 |
| 6,228,923 B1 | 5/2001 | Lombardi et al. | | |
| 7,300,619 B2 | 11/2007 | Napadensky et al. | | |
| 7,479,510 B2 * | 1/2009 | Napadensky | ......... | G03F 7/0037 522/75 |
| 9,126,365 B1 | 9/2015 | Mark et al. | | |
| 9,334,402 B2 | 5/2016 | Napadensky | | |
| 2005/0245420 A1 * | 11/2005 | Lewis | ....................... | C11D 7/06 510/407 |
| 2009/0250835 A1 * | 10/2009 | Takase | ................... | G03F 7/0017 264/227 |
| 2011/0079936 A1 | 4/2011 | Oxman | | |
| 2012/0178845 A1 | 7/2012 | Napadensky et al. | | |
| 2015/0018262 A1 * | 1/2015 | Massad | .................... | C11D 7/14 510/197 |
| 2017/0001382 A1 | 1/2017 | Stepper et al. | | |
| 2017/0252971 A1 | 9/2017 | Umebayashi | | |
| 2018/0230246 A1 | 8/2018 | Vidavsky et al. | | |

FOREIGN PATENT DOCUMENTS

| | | |
|---|---|---|
| CN | 103189187 | 7/2013 |
| CN | 103347682 | 10/2013 |
| EP | 1160312 | 12/2001 |
| EP | 2067594 | 6/2009 |
| EP | 3235630 | 10/2017 |
| EP | 3254835 | 12/2017 |
| JP | 57-7427 | 2/1982 |
| JP | 10-264362 | 10/1998 |
| JP | 2007-291317 | 11/2007 |
| JP | 2008-507619 | 3/2008 |
| JP | WO 2008/038540 | 3/2008 |
| JP | 2011-005658 | 1/2011 |
| JP | 2014-083744 | 5/2014 |
| JP | 2015-117276 | 6/2015 |
| JP | 2015-123684 | 7/2015 |
| JP | 2015-183103 | 10/2015 |
| WO | WO 95/35359 | 12/1995 |
| WO | WO 00/62994 | 10/2000 |
| WO | WO 2015/049873 | 4/2015 |
| WO | WO 2016/098636 | 6/2016 |
| WO | WO 2017/029657 | 2/2017 |
| WO | WO 2017/029658 | 2/2017 |

OTHER PUBLICATIONS

Translation Dated May 26, 2019 of Notification of Office Action dated Apr. 28, 2019 From the State Intellectual Property Office of the People'Republic of China Re. Application No. 201680048027 .5. (6 Pages).
Restriction Official Action dated Mar. 9, 2020 from the US Patent and Trademark Office Re. U.S. Appl. No. 15/752,621. (7 pages).
Translation Dated Sep. 24, 2019 of Notification of Office Action dated Aug. 5, 2019 From the State Intellectual Property Office of the People's Republic of China Re. Application No. 201680059093.2. (4 Pages).
Notification of Office Action and Search Report dated Apr. 28, 2019 From the State Intellectual Property Office of the People's Republic of China Re. Application No. 201680048027 .5. (6 Pages).
Supplementary European Search Report and the European Search Opinion dated Apr. 8, 2019 From the European Patent Office Re. Application No. 16836743.1. (6 Pages).
Supplementary European Search Report and the European Search Opinion dated May 10, 2019 From the European Patent Office Re. Application No. 16836744.9. (12 Pages).
Notification of Office Action and Search Report dated Aug. 5, 2019 From the State Intellectual Property Office of the People's Republic of China Re. Application No. 201680059093.2. (6 Pages).
Office Action dated Oct. 31, 2019 From the Israel Patent Office Re. Application No. 257510 and Its Translation Into English. (5 Pages).
Notice of Reason for Rejection dated Mar. 10, 2020 From the Japan Patent Office Re. Application No. 2017-567347 and Its Translation Into English. (9 Pages).
Notification of Office Action dated Mar. 20, 2020 From the State Intellectual Property Office of the People's Republic of China Re. Application No. 201680059093.2. (3 Pages).
Notification of Office Action dated Feb. 26, 2020 From the State Intellectual Property Office of the People's Republic of China Re. Application No. 201680048027.5 and Its Translation Into English. (12 Pages).
Translation Dated Apr. 10, 2020 of Notification of Office Action dated Mar. 20, 2020 From the State Intellectual Property Office of the People's Republic of China Re. Application No. 201680059093. 2. (3 Pages).
Notification of Office Action and Search Report dated Aug. 12, 2020 From the State Intellectual Property Office of the People's Republic of China Re. Application No. 201680048027 .5. (5 Pages).
International Preliminary Report on Patentability dated Mar. 1, 2018 From the International Bureau of WIPO Re. Application No. PCT/IL2016/050886. (9 Pages).
International Preliminary Report on Patentability dated Mar. 1, 2018 From the International Bureau of WIPO Re. Application No. PCT/IL2016/050887. (8 Pages).

(56) References Cited

OTHER PUBLICATIONS

International Search Report and the Written Opinion dated Nov. 14, 2016, From the International Searching Authority Re. Application No. PCT/IL2016/050886. (11 Pages).
International Search Report and the Written Opinion dated Nov. 14, 2016 From the International Searching Authority Re. Application No. PCT/IL2016/050887. (11 Pages).
Translation Dated Sep. 4, 2020 of Notification of Office Action dated Aug. 12, 2020 From the State Intellectual Property Office of the People's Republic of China Re. Application No. 201680048027 .5. (2 Pages).
Official Action dated Nov. 30, 2020 From the US Patent and Trademark Office Re. U.S. Appl. No. 15/752,621. (37 Pages).
Notice of Reasons for Rejection dated Aug. 21, 2020 From the Japan Patent Office Re. Application No. 2018-500768 and Its Translation Into English. (18 Pages).
Notification of Office Action and Search Report dated Sep. 11, 2020 From the State Intellectual Property Office of the People's Republic of China Re. Application No. 201680059093.2. (7 Pages).
Restriction Official Action dated Sep. 17, 2020 from the US Patent and Trademark Office Re. U.S. Appl. No. 15/752,621. (10 pages).
Translation Dated Oct. 20, 2020 of Notification of Office Action dated Sep. 11, 2020 From the State Intellectual Property Office of the People's Republic of China Re. Application No. 201680059093.2. (11 Pages).
Notification of Office Action and Search Report dated Dec. 22, 2020 From the State Intellectual Property Office of the People's Republic of China Re. Application No. 201680048027 .5 and Its Translation of Office Action Into English. (11 Pages).
Notice of Reason for Rejection dated Oct. 16, 2020 From the Japan Patent Office Re. Application No. 2017-567347 and Its Translation Into English. 8 Pages).
Final Official Action dated Mar. 10, 2021 From the US Patent and Trademark Office Re. U.S. Appl. No. 15/752,621. (14 Pages).
Office Action dated Apr. 7, 2021 From the Israel Patent Office Re. Application No. 257511 and Its Translation Into English. (7 Pages).
Advisory Action dated Jun. 16, 2021 from the US Patent and Trademark Office Re. U.S. Appl. No. 15/752,621. (11 pages).

* cited by examiner

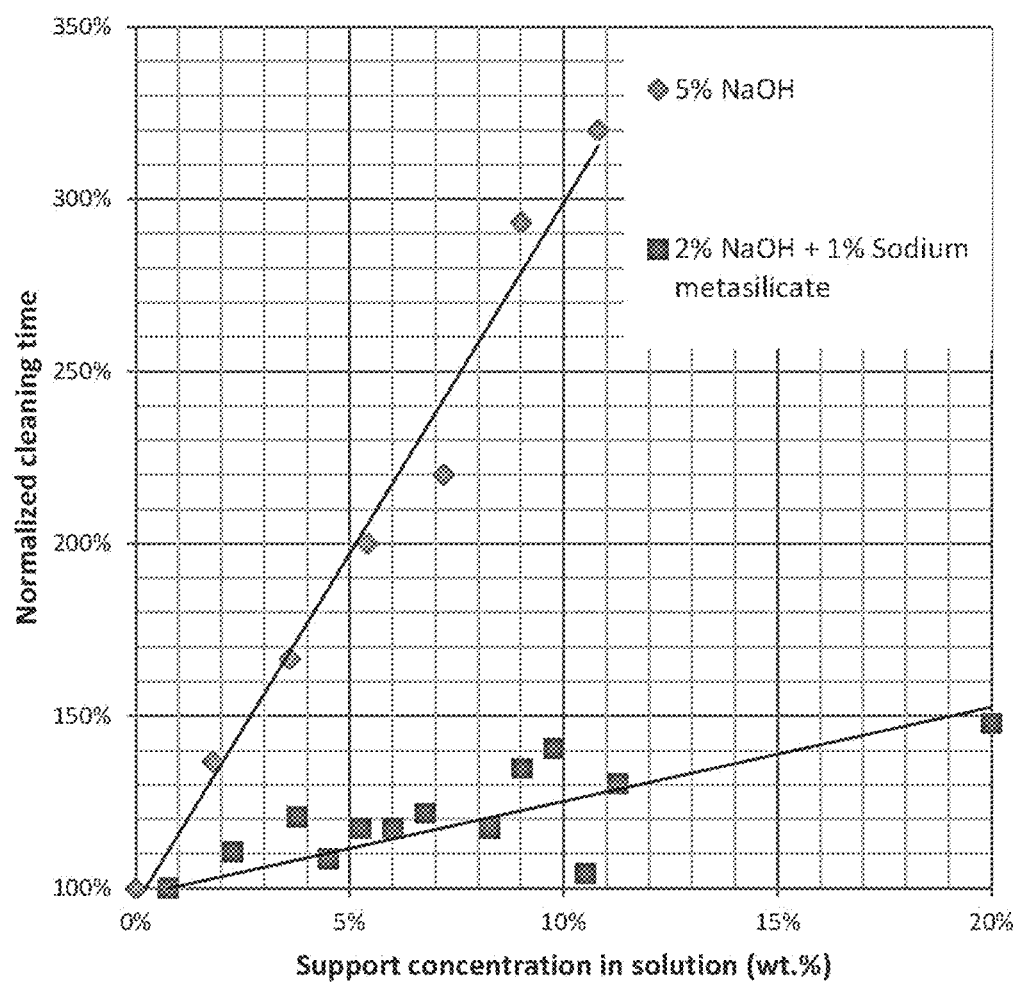

CLEANING COMPOSITION

RELATED APPLICATIONS

This application is a National Phase of PCT Patent Application No. PCT/IL2016/050887 having International filing date of Aug. 14, 2016, which claims the benefit of priority under 35 USC § 119(e) of U.S. Provisional Patent Application Nos. 62/205,009 and 62/205,010, both filed on Aug. 14, 2015. The contents of the above applications are all incorporated by reference as if fully set forth herein in their entirety.

FIELD AND BACKGROUND OF THE INVENTION

The present invention, in some embodiments thereof, relates to additive manufacturing (AM), and more particularly, but not exclusively, to formulations useful for removing a cured support material usable in additive manufacturing, also referred to as cleaning compositions, to kits for preparing the cleaning compositions, and to methods of additive manufacturing utilizing same.

Additive manufacturing (AM) is a technology enabling fabrication of arbitrarily shaped structures directly from computer data via additive formation steps (additive manufacturing; AM). The basic operation of any AM system consists of slicing a three-dimensional computer model into thin cross sections, translating the result into two-dimensional position data and feeding the data to control equipment which fabricates a three-dimensional structure in a layerwise manner.

Additive manufacturing entails many different approaches to the method of fabrication, including three-dimensional printing such as 3D inkjet printing, electron beam melting, stereolithography, selective laser sintering, laminated object manufacturing, fused deposition modeling and others.

Three-dimensional (3D) printing processes, for example, 3D inkjet printing, are being performed by a layer by layer inkjet deposition of building materials. Thus, a building material is dispensed from a dispensing head having a set of nozzles to deposit layers on a supporting structure. Depending on the building material, the layers may then be cured or solidified using a suitable device.

Various three-dimensional printing techniques exist and are disclosed in, e.g., U.S. Pat. Nos. 6,259,962, 6,569,373, 6,658,314, 6,850,334, 6,863,859, 7,183,335, 7,209,797, 7,225,045, 7,300,619, and 7,500,846 and U.S. Patent Application having Publication No. 20130073068, all by the same Assignee.

During the additive manufacturing (AM) process, the building material may include "model material" (also known as "object material" or "modeling material"), which is deposited to produce the desired model object, and frequently, another material ("support material" or "supporting material") is used to provide temporary support to the model object as it is being built. The other material is referred to herein and in the art as "support material" or "supporting material", and is used to support specific areas of the object during building and for assuring adequate vertical placement of subsequent object layers. For example, in cases where model objects include overhanging features or shapes, e.g. curved geometries, negative angles, voids, and the like, objects are typically constructed using adjacent support constructions, which are used during the printing and then subsequently removed in order to reveal the final shape of the fabricated model object.

The modeling material and the supporting material may be initially liquid and subsequently hardened to form the required layer shape. The hardening process may be performed by a variety of methods, such as UV curing, phase change, crystallization, drying, etc. In all cases, the support material is deposited in proximity of the modeling material, enabling the formation of complex object geometries and filling of object voids. In such cases, the removal of the hardened support material is liable to be difficult and time consuming, and may damage the formed final object. When using currently available commercial print heads, such as ink-jet printing heads, the support material should have a relatively low viscosity (about 10-20 cPs) at the working, i.e., jetting, temperature, such that it can be jetted. Further, the support material should harden rapidly in order to allow building of subsequent layers. Additionally, the hardened support material should have sufficient mechanical strength for holding the model material in place, and low distortion for avoiding geometrical defects.

Known methods for removal of support materials include mechanical impact (applied by a tool or water-jet), as well as chemical methods, such as dissolution in a solvent, with or without heating. The mechanical methods are labor intensive and are often unsuited for small intricate parts, and therefore chemical dissolution methods are often used.

For dissolving the support material, the fabricated object is often immersed in water or in a solvent that is capable of dissolving the support material. The solutions utilized for dissolving the support material are also referred to herein and in the art as "cleaning solution" or "cleaning composition". In many cases, however, the support removal process may involve hazardous materials, manual labor and/or special equipment requiring trained personnel, protective clothing and expensive waste disposal. In addition, the dissolution process is usually limited by diffusion kinetics and may require very long periods of time, especially when the support constructions are large and bulky. Furthermore, post-processing may be necessary to remove traces of a 'mix layer' on model object surfaces. The term "mix layer" refers to a residual layer of mixed hardened model and support materials formed at the interface between the two materials on the surfaces of the object being fabricated, by model and support materials mixing into each other at the interface between them. Still further, "saturation" of the cleaning solution is observed in some cases, requiring a process in which fresh batches of a cleaning solution are repeatedly introduced.

Additionally, methods requiring high temperatures during support removal may be problematic since there are model materials that are temperature-sensitive, such as waxes and certain flexible materials. Both mechanical and dissolution methods for removal of support materials are especially problematic for use in an office environment, where ease-of-use, cleanliness and environmental safety are major considerations.

Water-soluble materials for 3D building have been described in the art. For example, U.S. Pat. No. 6,228,923 describes a water soluble thermoplastic polymer—Poly(2-ethyl-2-oxazoline)—for use as a support material in a 3D building process involving high pressure and high temperature extrusion of ribbons of selected materials onto a plate.

Water-soluble compositions suitable for support in building a 3D object are also described, for example, in U.S. Pat. Nos. 7,479,510, 7,183,335 and 6,569,373, all to the present Assignee. Generally, the compositions disclosed in these patents comprise at least one UV curable (reactive) component, e.g., an acrylic component, at least one non-UV curable component, e.g. a polyol or glycol component, and a photoinitiator.

After irradiation, these compositions provide a semi-solid or gel-like material capable of dissolving or swelling upon exposure to water, to an alkaline or acidic solution or to a water detergent solution. 3D printing methodologies using such a soluble support material are also known as "Soluble Support Technology" or SST, and the support material formulation is often referred to as a "soluble support material" or "soluble support material formulation". A soluble support material is required to feature sufficient solubility in aqueous solution, so as to be removed during a relatively short time period and while using non-hazardous cleaning solutions, yet, at the same time, to exhibit mechanical properties sufficient to support the printed object during the additive manufacturing process.

Besides swelling, another characteristic of such a support material may be the ability to break down during exposure to water, to an alkaline or acidic solution or to a water detergent solution because the support material is made of hydrophilic components. During the swelling process, internal forces cause fractures and breakdown of the cured support. In addition, the support material can contain a substance that liberates bubbles upon exposure to water, e.g. sodium bicarbonate, which transforms into $CO_2$ when in contact with an acidic solution. The bubbles aid in the process of removal of support from the model.

Some detergent compositions, manufactured by Alconox® Detergents, comprise combinations of alkaline substances. These detergent compositions are said by the manufacturer to be used in a variety of biotechnological, laboratory, electronic, cleaning and other applications, not including additive manufacturing or any other printing processes.

SUMMARY OF THE INVENTION

There is an unmet need for improved methodologies for removing a hardened (e.g. cured) support material obtained in additive manufacturing processes such as 3D inkjet printing.

The present inventor has now designed and successfully practiced a novel cleaning solution, which efficiently removes a hardened support material from a printed object. The designed cleaning solution is an alkaline cleaning solution which supersedes currently practiced alkaline cleaning solutions that are characterized by poor dissolution rate and/or by a dissolution curve that reaches saturation (when common cleaning solutions are employed), and often require repeated replacement of the cleaning solution by a fresh batch of the solution.

The cleaning solution disclosed herein is particularly useful in removal of a cured support material that is dissolvable in concentrated alkaline solutions, e.g., aqueous solutions of 3% by weight or more of an alkaline hydroxide such as, for example, sodium hydroxide and/or potassium hydroxide.

Oftentimes, the dissolution rate of a cured support material that is dissolvable in an alkaline solution is low, and, notably, the dissolution rate is characterized by a saturation curve. The saturation of the currently practiced alkaline cleaning solutions as a result of the dissolution of the support material often requires replacing a batch of a cleaning solution by a fresh batch in order to achieve complete dissolution of the support material within a reasonable time.

The cleaning solution disclosed herein comprises a lower concentration of alkaline substances than the concentration required for dissolving a certain cured support material, and, notably, results in substantially constant dissolution rate, characterized by substantially non-saturation curve, of the cured support material. See, for example, FIG. 1.

The cleaning solution disclosed herein comprises an alkali metal hydroxide and an additional alkaline reagent (e.g., detergent) with buffering capacity, for example, an alkali metal silicate such as sodium metasilicate.

According to an aspect of some embodiments of the present invention there is provided a cleaning composition usable in removing a cured support material from a printed object obtained by additive manufacturing, the composition comprising an alkali metal hydroxide, an alkali metal silicate and water.

According to some of any of the embodiments described herein, a concentration of the alkali metal silicate is lower than 5 weight percents, or lower than 4 weight percents, or lower than 3 weight percents, of the total weight of the composition.

According to some of any of the embodiments described herein, a total concentration of the alkali metal hydroxide and the alkali metal silicate is lower than 10 weight percents, or lower than 8 weight percents, or lower than 6 weight percents, or lower than 5 weight percents or lower than 4 weight percents, of the total weight of the composition.

According to some of any of the embodiments described herein, a concentration of the alkali metal hydroxide ranges from 1 to 3 weight percents of the total weight of the composition.

According to some of any of the embodiments described herein, a concentration of the alkali metal silicate ranges from 1 to 3 weight percents of the total weight of the composition.

According to some of any of the embodiments described herein, a concentration of the alkali metal hydroxide ranges from 1 to 3 weight percents of the total weight of the composition, and a concentration of the alkali metal silicate ranges from 1 to 3 weight percents of the total weight of the composition.

According to some of any of the embodiments described herein, a concentration of the alkali metal hydroxide is 2 weight percents of the total weight of the composition.

According to some of any of the embodiments described herein, a concentration of the alkali metal silicate is 1 weight percent of the total weight of the composition.

According to some of any of the embodiments described herein, the composition is consisting of the alkali metal hydroxide, alkali metal silicate and water, the composition being an aqueous solution.

According to some of any of the embodiments described herein, the alkali metal hydroxide is sodium hydroxide.

According to some of any of the embodiments described herein, the alkali metal silicate is sodium metasilicate.

According to some of any of the embodiments described herein, a dissolution time of a cured support material in a printed object, upon contacting the printed object with the cleaning composition, is substantially the same as, or lower than, a dissolution time of the cured support material in the printed object, upon contacting the printed object with an aqueous solution containing 5 weight percents NaOH.

According to some of any of the embodiments described herein, a dissolution time of a cured support material in a printed object, upon contacting the printed object with the cleaning composition, increases by no more than 50% when the cleaning composition comprises at least 5 weight percents of dissolved support material, or at least 10 percents of dissolved support material, or at least 20 percents of dissolved support material.

According to an aspect of some embodiments of the present invention there is provided a kit comprising an alkali metal hydroxide and an alkali metal silicate, and a packaging material in which the alkali metal hydroxide and the alkali metal silicate are packaged, the kit being identified for use in preparation of a cleaning composition for removing a cured support material from a printed object obtained in additive manufacturing.

According to some of any of the embodiments described herein, the kit further comprises instructions to prepare an aqueous solution comprising from 1 to 3 weight percents of the alkali metal hydroxide and 1-3 weight percents of the alkali metal silicate, to thereby prepare the cleaning composition.

According to some of any of the embodiments described herein, a weight ratio of the alkali metal hydroxide to the alkali metal silicate packaged in the kit is 2:1.

According to some of any of the embodiments described herein, the kit further comprises instructions to prepare the cleaning composition by adding 97 grams water per 2 grams of the alkali metal hydroxide and 1 gram of the alkali metal silicate.

According to some of any of the embodiments described herein, the alkali metal hydroxide and the alkali metal silicate are packaged separately in the kit.

According to some of any of the embodiments described herein, the kit consists of the alkali metal hydroxide and the alkali metal silicate.

According to an aspect of some embodiments of the present invention there is provided a method of fabricating a three-dimensional model object, the method comprising:

dispensing a building material so as to sequentially form a plurality of layers in a configured pattern corresponding to the shape of the object, wherein the building material comprises a modeling material formulation and a support material formulation;

subsequent to the dispensing, exposing the building material to curing energy, to thereby obtain a printed object comprised of a cured modeling material and a cured support material; and contacting the printed object with a cleaning composition according to any one of respective embodiments and any combination thereof, to thereby remove the cured support material from the cured modeling material, thereby obtaining the three-dimensional model object.

According to some of any of the embodiments described herein, the cured support material comprises cross-linked polymeric chains, for example, a cross-linked polyacrylate.

According to an aspect of some embodiments of the present invention there is provided a three-dimensional model fabricated by the method as described herein.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 presents comparative plots showing normalized cleaning times of a cured support material in 5% wt. NaOH solution and in an exemplary cleaning solution according to embodiments of the invention, containing 2% wt. NaOH+ 1% wt. Sodium metasilicate, as a function of dissolved support material concentration in the solution. The normalized cleaning time is referred to the dissolution time at a certain support material concentration in the solution, divided by the initial dissolution time of a support material of an identical object in a fresh solution (0% support material concentration).

DESCRIPTION OF SPECIFIC EMBODIMENTS OF THE INVENTION

The present invention, in some embodiments thereof, relates to additive manufacturing (AM), and more particularly, but not exclusively, to formulations useful for removing a support material usable in additive manufacturing, also referred to as cleaning compositions, to kits for preparing the cleaning compositions, and to methods of additive manufacturing utilizing same.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present inventor has now designed a novel cleaning composition, usable for removing a cured support material from a printed object obtained by an additive manufacturing process such as 3D inkjet printing. The cleaning compositions are aqueous alkaline compositions containing a combination of two alkaline substances: an alkali metal hydroxide and an alkali metal silicate, each at a concentration of no more than 3 weight percents of the total weight of the composition. The cleaning compositions are characterized by high and constant dissolution rate, are particularly useful for removing a cured support material that includes cross-linked polymeric chains, and are safer for use compared to cleaning compositions currently practiced in removing such a cured support material.

According to an aspect of some embodiments of the present invention there is provided a cleaning composition usable in removing a cured support material from a printed object obtained by additive manufacturing.

Herein throughout, the term "object" or "printed object" describes a product of the manufacturing process. This term refers to the product obtained by a method as described herein, before removal of the support material. A printed object is therefore made of hardened (e.g., cured) modeling material and hardened (e.g., cured) support material.

The term "printed object" as used herein throughout refers to a whole printed object or a part thereof.

The term "model", as used herein, describes a final product of the manufacturing process. This term refers to the product obtained by a method as described herein, after removal of the support material. The model therefore essentially consists of a cured modeling material, unless otherwise indicated. This term is also referred to herein as "model object", "final object" or simply as "object".

The terms "model", "model object", "final object" and "object", as used herein throughout, refer to a whole object or a part thereof.

Herein throughout, the phrase "uncured building material" collectively describes the materials that are dispensed during the fabrication process so as to sequentially form the layers, as described herein. This phrase encompasses uncured materials dispensed so as to form the printed object, namely, one or more uncured modeling material formulation(s), and uncured materials dispensed so as to form the support, namely uncured support material formulations.

Herein throughout, the phrases "cured modeling material" and "hardened modeling material", which are used interchangeably, describe the part of the building material that forms a model object, as defined herein, upon exposing the dispensed building material to curing, and following removal of the cured support material. The cured modeling material can be a single cured material or a mixture of two or more cured materials, depending on the modeling material formulations used in the method, as described herein.

Herein throughout, the phrase "modeling material formulation", which is also referred to herein interchangeably as "modeling formulation" or simply as "formulation", describes a part of the uncured building material which is dispensed so as to form the model object, as described herein. The modeling formulation is an uncured modeling formulation, which, upon exposure to curing energy, forms the final object or a part thereof.

An uncured building material can comprise one or more modeling formulations, and can be dispensed such that different parts of the model object are made upon curing different modeling formulations, and hence are made of different cured modeling materials or different mixtures of cured modeling materials.

Herein throughout, the phrase "hardened support material" is also referred to herein interchangeably as "cured support material" or simply as "support material" and describes the part of the building material that is intended to support the fabricated final object during the fabrication process, and which is removed once the process is completed and a hardened modeling material is obtained.

Herein throughout, the phrase "support material formulation", which is also referred to herein interchangeably as "support formulation" or simply as "formulation", describes a part of the uncured building material which is dispensed so as to form the support material, as described herein. The support material formulation is an uncured formulation, which, upon exposure to curing energy, forms the hardened support material.

Herein throughout, the term "water-miscible" describes a material which is at least partially dissolvable or dispersible in water, that is, at least 50% of the molecules move into the water upon mixture. This term encompasses the terms "water-soluble" and "water dispersible".

Herein throughout, the term "water-soluble" describes a material that when mixed with water in equal volumes or weights, a homogeneous solution is formed.

Herein throughout, the term "water-dispersible" describes a material that forms a homogeneous dispersion when mixed with water in equal volumes or weights.

Herein throughout, the phrase "dissolution rate" describes a rate at which a substance is dissolved in a liquid medium. Dissolution rate can be determined, in the context of the present embodiments, by the time needed to dissolve a certain amount of support material. The measured time is referred to herein as "dissolution time".

Herein throughout, whenever the phrase "weight percents" is indicated in the context of embodiments of a support material formulation, it is meant weight percents of the total weight of the uncured support material formulation as described herein.

Herein throughout, whenever the phrase "weight percents" is indicated in the context of embodiments of a cleaning composition, it is meant weight percents of the total weight of the cleaning composition or solution as described herein.

The phrase "weight percents" is also referred to herein as "% by weight" or "% wt.".

Herein throughout, some embodiments of the present invention are described in the context of the additive manufacturing being a 3D inkjet printing. However, other additive manufacturing processes, such as, but not limited to, SLA and DLP, are contemplated.

The Cleaning Composition:

According to some embodiments of the present invention, the cleaning composition is an alkaline cleaning composition, and in some embodiments, it is an alkaline aqueous cleaning composition or an alkaline aqueous cleaning solution. The term "cleaning composition" as described herein, in some embodiments, encompasses, and is interchangeable to, the term "cleaning solution".

According to some of any of the embodiments described herein, the cleaning composition, or cleaning solution, comprises a combination of two alkaline substances: an alkali metal hydroxide and an additional alkaline substance that exhibits buffering capacity.

By "buffering capacity" it is meant herein that the substance is capable of acting as a buffering agent, such that a pH of a solution containing the substance remains substantially unchanged, or changes very little, when a small or moderate amount of strong acid or strong base is added to the solution. Thus, a solution containing the substance exhibits resistance to pH change on addition or depletion of hydroxide ions.

According to some embodiments, the additional alkaline substance is an alkaline detergent.

According to some of any of the embodiments described herein, the additional alkaline substance is an alkali metal silicate.

According to some of any of the embodiments described herein, the cleaning composition, or solution, comprises, in addition to the alkaline substances, water.

According to some of any of the embodiments described herein, the cleaning composition, or solution, consists of the two alkaline substances, as described herein, and water.

According to some of any of the embodiments described herein, the alkali metal hydroxide (M—OH, wherein M is an alkali metal such as Li, Na, K and more) is an alkali metal hydroxide commonly used in cleaning compositions of cured support materials that are non-soluble in water. Such alkali metal hydroxides typically include sodium hydroxide, potassium hydroxide or a mixture thereof. However, other alkali metal hydroxides are contemplated. In some embodiments, the alkali metal hydroxide is sodium hydroxide (NaOH).

The term "alkali metal silicate" describes a substance made of alkali metal oxide and silica ($SiO_2$), and is typically represented by the formula $M_2O.SiO_2)n$ or, interchangeably, $M_2(SiO_2)nO$, where M is an alkali metal, typically sodium or potassium, and n represents the mol ratio between silica and the alkali metal oxides, and ranges from 1.00 to about 3.00. When n=1, an alkali metal silicate is denoted alkali metal metasilicate, and is represented by the formula $M_2SiO_3$.

Most common alkali metal silicates are sodium silicates, represented by the formula $Na_2O.(SiO_2)n$ or $Na_2(SiO_2)nO$, or by the formula $Na_2SiO_3$ for sodium metasilicate.

The alkali metal silicate can be in an anhydrous form, or in a hydrate form, where it is represented by the formula: $M_2SiO_3.nH_2O$ (wherein n=5, 6, 8, 9). The hydrates are structured as containing a $Si(OH)_2^{-2}$ anion, formed with one of the water molecules. For example, the sodium metasilicate pentahydrate $Na_2SiO_3.5H_2O$ is structured as $Na_2SiO_2(OH)_2.4H_2O$. It is to be noted that when a hydrate form of the alkali metal silicate is used, the weight percents of the hydrate form of the total weight of the cleaning composition are such that the indicated weight percents of the alkali metal silicate without the absorbed water molecules are used.

According to some of any of the embodiments described herein, the alkali metal hydroxide is sodium hydroxide and the alkali metal silicate is sodium metasilicate, as described herein.

According to some of any of the embodiments described herein, a concentration of the alkali metal silicate is lower than 5 weight percents, or lower than 4 weight percents, or lower than 3 weight percents, of the total weight of the composition.

According to some of any of the embodiments described herein, a total concentration of the alkali metal hydroxide and the alkali metal silicate is lower than 10 weight percents, or lower than 8 weight percents, or lower than 6 weight percents, or lower than 5 weight percents or lower than 4 weight percents, of the total weight of the composition.

According to some of any of the embodiments described herein, a concentration of the alkali metal hydroxide is no more than 3 weight percents, and in some embodiments, it ranges from 1 to 3 weight percent of the total weight of the composition.

According to some of any of the embodiments described herein, a concentration of the alkali metal silicate ranges from 1 to 3 weight percent of the total weight of the composition.

According to some of any of the embodiments described herein, a concentration of the alkali metal hydroxide ranges from 1 to 3 weight percents of the total weight of the composition, and a concentration of the alkali metal silicate ranges from 1 to 3 weight percents of the total weight of the composition.

According to some of any of the embodiments described herein, a concentration of the alkali metal hydroxide is 2 weight percents of the total weight of the composition. According to some of any of the embodiments described herein, a concentration of the alkali metal silicate is 1 weight percent of the total weight of the composition.

A preferred cleaning composition, according to embodiments of the present invention, comprises sodium hydroxide at a concentration that ranges from 1-3 weight percents, or at a concentration of 2 weight percents; and sodium metasilicate at a concentration of 1-3 weight percents, or at a concentration of 1 weight percent.

A preferred cleaning composition, according to embodiments of the present invention, consists of sodium hydroxide at a concentration that ranges from 1-3 weight percents, or at a concentration of 2 weight percents; and sodium metasilicate at a concentration of 1-3 weight percents, or at a concentration of 1 weight percent, the remaining of the composition being water.

Herein throughout, the indicated weight percents of an alkali metal silicate are for an anhydrous form thereof.

As discussed herein, the cleaning composition described herein efficiently dissolves a cured support material, at high and constant dissolution rate and at a relatively low dissolution time.

According to some of any of the embodiments described herein, a dissolution time of a cured support material in a printed object, upon contacting the printed object with the cleaning composition, is substantially the same as, or lower than, a dissolution time of the same cured support material in an identical printed object, upon contacting the printed object with an aqueous solution containing 5 weight percents NaOH.

The phrase "cured support material in a printed object" encompasses a printed object obtained in additive manufacturing from a modeling material formulation and a support material formulation, and printed object obtained in additive manufacturing from only a support material formulation, for experimental purposes.

According to some of any of the embodiments described herein, a dissolution time of a cured support material in a printed object, upon contacting the printed object with the cleaning composition, increases by no more than 50% when the cleaning composition comprises at least 5 weight percents of dissolved support material, or at least 10 percents of dissolved support material, or at least 20 percents of dissolved support material.

That is, a change in a dissolution time of a cured support material in a printed object changes by no more than 50%, as the amount (load) of dissolved support material in the cleaning composition increases. As a comparison, for the same support material formulation, the change of the dissolution time of the cured support material in a printed object in a 5% NaOH is at least 10-folds higher.

In some embodiments of the present invention, the cleaning compositions described herein enable to perform repeated dissolutions of a cured support material, for example, repeated removals of cured support material from printed objects, without a need to replace the cleaning composition after between removal procedures. That is, a plurality of objects from which a cured support material should be removed can be contacted with the cleaning composition, consequently, one object after another, without the need to replace the cleaning composition, and while maintaining satisfying, and substantially constant, dissolution rates of the cured support material.

The cleaning compositions described herein can be used for efficiently dissolving, at a dissolution time that is no more than 50% higher compared to fresh cleaning composition (containing 0% of dissolved cured support material), a cured support material in a printed object as long as the load of dissolved support material in the composition does not exceed 10%, or 15%, or 20%, by weight of the cleaning composition, or even higher loads.

Kits:

According to an aspect of some embodiments of the present invention there are provided kits for preparing a cleaning composition as described herein.

In some embodiments, a kit as described herein comprises an alkali metal hydroxide, as described herein in any of the respective embodiments, and an alkali metal silicate, as described herein in any of the respective embodiments, packaged within the kit.

In some embodiments, the kit is identified for use in preparation of a cleaning composition for removing a cured support material, as described herein in any of the respective embodiments, from a printed object obtained in additive manufacturing, as described herein in any of the respective embodiments.

In some embodiments, the kit is identified for use in preparation of a cleaning composition for use in additive manufacturing (e.g., 3D inkjet printing) of a three-dimensional object, as described herein. In some embodiments, the additive manufacturing utilizes a support material formulation as described herein in any of the respective embodiments.

In some embodiments, the kit further comprises instructions to prepare an aqueous solution comprising from 1 to 3 weight percents of the alkali metal hydroxide and from 1 to 3 weight percents of the alkali metal silicate, to thereby prepare the cleaning composition.

The instructions, for example, can be printed on the kit's package or on a leaflet within the kit. The instructions may include, for example, weighing an amount of the alkali metal hydroxide and an amount of the alkali metal silicate, and adding water in an amount to obtain the indicated concentrations.

Alternatively, the instructions may guide the user to add an amount of the alkali metal hydroxide and an amount of the alkali metal silicate which would achieve the indicated concentrations of each substance in a predetermined amount of water.

In some embodiments, a weight ratio of the alkali metal hydroxide to the alkali metal silicate packaged in the kit is 2:1.

In some of these embodiments, the kit may further comprises instructions to prepare a cleaning composition by adding 97 grams water per 2 grams of said alkali metal hydroxide and 1 gram of said alkali metal silicate.

When the alkaline substances are packaged together in the kit, as a mixture, the instructions can be adding 97 grams per 3 grams of the mixture, or by adding 3 grams of the mixture per 97 grams of water.

According to some of any of the embodiments described herein, the alkali metal hydroxide and the alkali metal silicate are packaged separately in the kit. Alternatively, the alkali metal hydroxide and the alkali metal silicate are packaged together in the kit, as a ready to use mixture, for example, at a 2:1 weight ratio.

According to some of any of the embodiments described herein, the alkali metal hydroxide and the alkali metal silicate are packaged together in the kit, as a ready to use mixture, for example, at a 2:1 weight ratio, or at any other ratio as described herein, and in a total amount that is suitable for obtaining a cleaning solution as described herein which has a pre-determined weight (for example, in accordance with a certain cleaning apparatus). Such a kit may further comprise instructions to add the mixture to a container filled with a pre-determined amount of water, to achieve the indicated concentrations of the alkaline substances.

For example, a kit as described herein is for preparing 10 Kg of a cleaning solution, or for preparing a cleaning solution in a 10-Liters container, and comprises from 100 grams to 300 grams, or 200 grams, alkali metal hydroxide as described herein, and from 100 grams to 300 grams, or 100 grams, alkali metal silicate as described herein. The kit comprises instruction to add the mixture to a container filled with from 9400 grams water to 9800 grams water, or with 9700 grams water for a 200 grams alkali metal hydroxide +100 grams alkali metal silicate, so as to obtain a 10 Kg cleaning solution according to embodiments of the present invention. Such a kit is useful for preparing a cleaning solution suitable for use with certain cleaning apparatus.

Any packaging material usable for packaging solid alkaline substances as described herein is contemplated. In some embodiments, the alkaline substances are compacted to form, for example, a tablet. In some embodiments, the alkaline substances are in a form of a powder, or granules, or pellets, and the like.

Removable Support Material:

The cleaning compositions as described herein, and the kits for preparing the compositions, are suitable for, or usable in, removing a support material, that is, separating a cured support material from a cured modeling material in an object formed by additive manufacturing (e.g., a printed object as described herein, formed by 3D inkjet printing), as described herein.

Cured support materials that can be beneficially removed by the cleaning composition as described herein are cured support materials that are not water-soluble.

In some embodiments, cured support materials that are suitable to be removed by the cleaning composition as described herein are cured support materials that are known to be removed by concentrated (e.g., 5% wt.) solutions of a metal alkali hydroxide as described herein.

Such cured support materials typically comprise, at least to some extent, cross-linked polymeric chains.

As known in the art, support material formulations typically comprise one or more curable materials (e.g., curable monomers, oligomers or polymers), which, when subjected to curing energy, polymerize to form a polymeric material. Some support material formulations comprise multi-functional (e.g., di-functional) curable materials, optionally in addition to mono-functional curable materials. Some support material formulations comprise a mono-functional curable material, and one or both of a cross-linking agent and a multi-functional (e.g., di-functional) curable material that can function as a cross-linking agent, at least to some degree.

Support material formulations that comprise one or more multi-functional (e.g., di-functional) curable materials, either as the sole curable material or in addition to one or more mono-functional curable materials, typically form a cured support material which comprises cross-linked polymeric chains.

Support material formulations that comprise one or more mono-functional curable materials, and in addition to one or more multi-functional curable materials and/or a cross-linking agent, typically form a cured support material which comprises cross-linked polymeric chains.

The following describes some exemplary embodiments of curable materials which can be included in a support material formulation that forms a cured support material which is beneficially removable by the cleaning composition as described herein.

Herein throughout, a "curable material" is a compound or a mixture of compounds (monomeric and/or oligomeric and/or polymeric compounds) which, when exposed to curing energy, as described herein, solidify or harden to form a cured support material as defined herein. Curable materials are typically polymerizable materials, which undergo polymerization and/or cross-linking when exposed to suitable energy source.

A "curable material" is also referred to herein and in the art as "reactive" material.

In some of any of the embodiments described herein, a curable material is a photopolymerizable material, which polymerizes or undergoes cross-linking upon exposure to radiation, as described herein, and in some embodiments the curable material is a UV-curable material, which polymerizes or undergoes cross-linking upon exposure to UV-vis radiation, as described herein.

In some embodiments, a curable material as described herein is a polymerizable material that polymerizes via photo-induced radical polymerization.

In some of any of the embodiments described herein, a curable material can comprise a monomer, and/or an oligomer and/or a short-chain polymer, each being polymerizable as described herein.

In some of any of the embodiments described herein, when a curable material is exposed to curing energy (e.g., radiation), it polymerizes by any one, or combination, of chain elongation and cross-linking.

In some of any of the embodiments described herein, a curable material is a monomer or a mixture of monomers which can form a polymeric support material upon a polymerization reaction, when exposed to curing energy at which the polymerization reaction occurs. Such curable materials are also referred to herein as "monomeric curable materials", or as "curable monomers".

In some of any of the embodiments described herein, a curable material is a polymer or an oligomer or a mixture of polymers and/or oligomers which can form a polymeric support material upon a polymerization reaction, when exposed to curing energy at which the polymerization reaction occurs.

A curable material can comprise a mono-functional curable material and/or a multi-functional curable material.

Herein, a mono-functional curable material comprises one functional group that can undergo polymerization when exposed to curing energy (e.g., radiation). A multi-functional curable material comprises two or more groups that can undergo polymerization when exposed to curing energy (e.g., radiation), and which in addition can participate in chemical cross-linking of polymeric chains formed upon exposure to curing energy.

In some of any of the embodiments described herein, the curable materials described herein are water-soluble or at least water-miscible, e.g., water-dispersible, as defined herein.

In some of any of the embodiments described herein, the curable mono-functional material comprises one or more hydrophilic substituents, which enhance its solubility in aqueous solutions.

As used herein throughout, the term "hydrophilic" describes a physical property of a compound or a portion of a compound (e.g., a chemical group in a compound) which accounts for transient formation of bond(s) with water molecules, typically through hydrogen bonding.

A hydrophilic group is one that is typically charge-polarized and capable of hydrogen bonding.

Hydrophilic groups typically include one or more electron-donating heteroatoms which form strong hydrogen bonds with water molecules. Such heteroatoms include, but are not limited to, oxygen and nitrogen.

Hydrophilic groups are typically polar groups, comprising one or more electron-donating heteroatoms such as oxygen and nitrogen. Exemplary hydrophilic groups include, but are not limited to, an electron-donating heteroatom, a carboxylate, a thiocarboxylate, oxo (=O), a linear amide, hydroxy, a (C1-4)alkoxy, an (C1-4)alcohol, a heteroalicyclic (e.g., having a ratio of carbon atoms or heteroatoms as defined herein), a cyclic carboxylate such as lactone, a cyclic amide such as lactam, a carbamate, a thiocarbamate, a cyanurate, an isocyanurate, a thiocyanurate, urea, thiourea, an alkylene glycol (e.g., ethylene glycol or propylene glycol), a phosphate, a phosphonate, a sulfate, a sulfonate, sulfonamide, and any combinations thereof (e.g., a hydrophilic group that comprises two or more of the indicated hydrophilic groups).

A curable mono-functional material according to some embodiments of the present invention can be a vinyl-containing compound represented by Formula I:

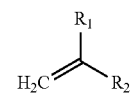

Formula I wherein at least one of $R_1$ and $R_2$ is and/or comprises a hydrophilic group, as defined herein.

The (=CH$_2$) group in Formula I represents a polymerizable group, and is typically a UV-curable group, such that the material is a UV-curable material.

For example, $R_1$ is a hydrophilic group as defined herein and $R_2$ is a non-hydrophilic group, for example, hydrogen, C(1-4) alkyl, C(1-4) alkoxy, or any other substituent, as long as the compound is water-soluble.

In some embodiments, $R_1$ is a carboxylate, and the compound is a mono-functional acrylate monomer. In some of these embodiments, $R_2$ is methyl, and the compound is mono-functional methacrylate monomer. In other embodiments, $R_2$ is a hydrophilic substituent, namely, a substituent which is, or which comprises, a hydrophilic group as described herein.

In some of any of these embodiments, the carboxylate group, —C(=O)—OR', comprises R' which is a hydrophilic group. Exemplary R' groups include, but are not limited to, heteroalicyclic groups (having a ratio of 5:1 or lower of carbon atoms to electron-donating heteroatoms, such as morpholine, tetrahydrofuran, oxalidine, and the likes), hydroxyl, C(1-4)alkyl optionally substituted or interrupted by one or more hydrophilic groups (e.g., hydroxy, —O—, amine or —NH—), hydroxy, thiol, an alkylene glycol, a poly(alkylene glycol) or an oligo(alkylene glycol). An exemplary such monomer is a poly(alkylene glycol) acrylate such as poly(ethylene glycol) acrylate. Other water soluble acrylate or methacrylate mono-functional monomers are contemplated.

In some embodiments, $R_1$ is amide, and the compound is a mono-functional acrylamide monomer. In some of these embodiments, $R_2$ is methyl, and the compound is mono-functional methacrylamide monomer. In some of these embodiments, the amide is substituted. For example, the amide group —C(=O)—NR'R" can comprise one or both of R' and R" which is a hydrophilic group, as described herein for R'. Exemplary such monomers include acryloyl morpholine (ACMO), hydroxyethyl acrylamide, N-(3,3-dimethylaminopropyl) methacrylamide, and methacrylamide (2-methyl-propenamide). Other water soluble acrylamide or methacrylamide mono-functional monomers are contemplated.

In some embodiments, one or both of $R_1$ and $R_2$ is a hydrophilic group other than carboxylate or amide, for example, is a cyclic amide (lactam), a cyclic ester (lactone), a phosphate, phosphonate, sulfate, sulfonate, alkoxy, substituted alkoxy, or else. In such embodiments, the monomer is a substituted vinyl monomer. Exemplary such vinyl monomers are vinyl phosphonic acid and hydroxybutyl vinyl ether. Other water soluble mono-functional vinyl ethers or otherwise substituted vinyl monomers are contemplated.

In some of any of the embodiments described herein, the support material formulation usable for forming a cured support material as described herein, comprises one or more curable monomers as described herein.

In some of any of the embodiments described herein, the support material formulation usable for forming a cured support material as described herein, comprises one or more curable mono-functional monomers as described herein, and one or more di-functional curable monomers as described herein, and are known in the art. In some embodiments, a di-functional curable monomer is represented by the Formula II:

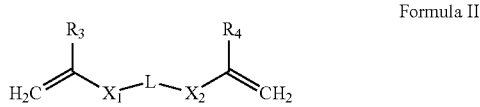

Formula II wherein:
each of $R_3$ and $R_4$ is independently hydrogen, C(1-4)alkyl, or a hydrophilic group, as defined herein;
L a linking moiety; and
each of $X_1$ and $X_2$ is independently a carboxylate, an amide, or any other group as defined herein for $R_1$.

Di-functional curable monomers of Formula II in which one or both of $X_1$ and $X_2$ is carboxylate, are di-functional acrylates. When one or more of $R_3$ and $R_4$ is methyl, the curable monomer is a di-functional methacrylate.

In some embodiments, L is a polymeric or oligomeric moiety. In some embodiments, L is or comprises an alkylene glycol moiety, or a poly(alkylene glycol) moiety. In some embodiments, L is an alkylene moiety, optionally interrupted by one or more heteroatoms such as O, S or by NR'.

Exemplary di-functional curable monomers include polyethylene glycol diacrylate, polyethylene glycol dimethacrylate, polyethylene glycol-polyethylene glycol urethane diacrylate, and a partially acrylated polyol oligomer.

In some of any of the embodiments of an acrylate or methacrylate di-functional curable material of Formula II, one or both of $R_3$ and $R_4$ is a hydrophilic group as described, for example, for R' in Formula I, herein.

Alternatively, one or both of $X_1$ and $X_2$ is —O—, such that at least one functional moiety in the di-functional curable monomer is vinyl ether.

In some of any of the embodiments described herein, the support material formulation comprises a mixture of a mono-functional curable monomer and a multi-functional curable monomer, and in some of these embodiments the multi-functional curable monomer is a di-functional curable monomer, as described herein in any of the respective embodiments and any combination thereof.

Any other curable monomer that is usable for forming cured support materials in AM processes is contemplated herein as included in a support material formulation, in addition to, or instead of, the curable monomers described herein.

Exemplary other curable monomers include, without limitation, diacrylates such as polyurethane diacrylate oligomer and/or monomeric diacrylates, preferably short chain diacrylates such as, but not limited to, isobornyl diacrylate.

In some of any of the embodiments described herein, each of curable monomers included in the support material formulation is a UV-curable material, as defined herein, for example, an acrylate or a methacrylate (mono-functional or multi-functional, monomeric or oligomeric).

In some of any of the embodiments described herein, a support material formulation comprises, in addition to the curable monomers, a water-miscible polymeric material, which can be any of the water-miscible polymeric materials commonly used in support material formulations.

In some of any of the embodiments described herein, the water-miscible polymeric material is non-curable (also referred to herein as "non-reactive"). The term "non-curable" encompasses polymeric materials that are non-polymerizable under any conditions or polymeric materials that are non-curable under conditions at which the mono-functional monomer as described herein is curable, or under any condition used in a fabrication of an object. Such polymeric materials are typically devoid of a polymerizable group or of a UV-photopolymerizable group. In some embodiments, the polymeric material is non-reactive towards the curable monomer as described herein, that is, it does not react with the monomer and is incapable of interfering with the curing of the monomer, under the fabrication conditions, including the curing conditions.

In some of any of the embodiments described herein the polymeric material is water soluble or water dispersible or water miscible polymeric material, as defined herein.

In some embodiments, the polymeric material comprises a plurality of hydrophilic groups as defined herein, either within the backbone chain of the polymer or as pendant groups. Exemplary such polymeric materials are polyols. Some representative examples include, but are not limited to, Polyol 3165, polypropylene glycol, polyethylene glycol, poly glycerol, ethoxylated forms of these polymers, paraffin oil and the like, and any combination thereof.

In some of any of the embodiments described herein, the support material formulation further comprises a water-miscible, non-curable, non-polymeric material, such as, for example, propane diol.

A support material formulation as described herein in any of the respective embodiments can further comprise additional agents, for example, initiators, inhibitors, stabilizers and the like.

Exemplary support material formulations according to some embodiments of the present invention comprise the following substances:

One or more curable mono-functional monomer(s), as described herein; and

One or more non-curable water miscible polymer(s), for example, one or more polyol(s), as described herein; and Optionally, one or more di-functional or multi-functional curable monomers, as described herein.

Further optionally, one or more of the curable mono-functional monomers in the cured support material formulation is capable of interfering with intermolecular interactions (e.g., chemical cross-linking) formed between the polymeric chains upon. Such a curable monomer can feature two or more hydrogen bond-forming chemical moieties, and can be, for example, an acrylamide substituted by a chemical moiety that is capable of forming hydrogen bonds, e.g., comprises one or more atoms of oxygen and/or nitrogen.

In some of any of the embodiments described herein, the cleaning composition as described herein is suitable for dissolving a cured support material, or for removing a cured support material from a printed object, wherein the cured support material is formed from a support material formulations which comprises:

a water-miscible (e.g., non-curable) polymer as described herein, at a concentration that ranges from 30% to 80% by weight of the total weight of the formulation;

a poly(alkylene glycol) acrylate, optionally in combination with a poly(alkylene glycol) diacrylate, at weight ratio of from 70:30 to 95:5, and at a total concentration of from 5 to 30 weight percents of the total weight of the formulation; and one or more curable materials independently represented by the following formula:

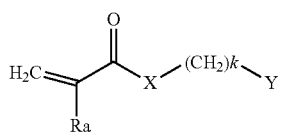

wherein:

Ra is selected from H, C(1-4) alkyl (e.g., methyl) or, optionally, can be a hydrophilic group, as described herein;

k is an integer ranging from 1 to 10, or from 2- to 10, or from 2 to 8, or from 2 to 6, or from 2 to 4, or is 2 or 3;

Y can be hydroxyl, alkoxy, aryloxy, amine, alkylamine, dialkylamine, carboxylate, hydrazine, carbamate, hydrazine, a nitrogen-containing heteroalicyclic, and an oxygen-containing heteroalicyclic, as defined herein; and X is —O— or —NRc-, wherein Rc can be, for example, hydrogen, alkyl, cycloalkyl or aryl, wherein the alkyl, cycloalkyl and aryl can be substituted or unsubstituted, as described herein, at a concentration that ranges from 5 to 40 or from 5 to 20 weight percents of the total weight of the formulation.

According to some of these embodiments, the support material formulation further comprises an initiator (e.g., a photoinitiator) at a concentration of from 0.1-2 weight percents of the total weight of the composition; an inhibitor at a concentration of from 0 to 2 weight percents of the total weight of the composition; and a surfactant, at a concentration of 0 to 2 weight percents of the total weight of the composition.

In some of any of the embodiments described herein, and any combination thereof, the support material formulation further comprises an initiator, for inducing a polymerization of the curable material upon exposure to curing energy or curing conditions.

In some of these embodiments, the curable material is a UV-curable material and the initiator is a photoinitiator.

The photoinitiator can be a free radical photo-initiator, a cationic photo-initiator, or any combination thereof.

In some of any of the embodiments described herein, the cleaning composition as described herein is suitable for dissolving a cured support material, or for removing a cured support material from a printed object, wherein the cured support material is as described in U.S. Provisional Patent Application No. 62/205,009, the teachings of which are incorporated by reference as if fully set forth herein.

Model Fabrication:

According to an aspect of some embodiments of the present invention there is provided a method of fabricating a three-dimensional model object, which utilizes a support material formulation and a cleaning composition as described herein. The method is also referred to herein as a fabrication process or as a model fabrication process. In some embodiments, the method comprises dispensing an uncured building material so as to sequentially form a plurality of layers in a configured pattern corresponding to the shape of the object. In some embodiments, the (uncured) building material comprises a modeling material formulation and a support material formulation.

The modeling material formulation can be any modeling material formulation used in additive manufacturing such as 3D inkjet printing, and is preferably curable under the same conditions at which the support material formulation is curable. The support material formulation can be as described herein in any of the respective embodiments and any combination thereof.

According to some embodiments of the present invention, the fabrication method is additive manufacturing of a three-dimensional model object.

According to some embodiments of this aspect, formation of each layer is effected by dispensing at least one uncured building material, and exposing the dispensed building material to curing energy or curing conditions, to thereby form a cured building material, which is comprised of a cured modeling material and a cured support material.

According to some of any of the embodiments described herein, the additive manufacturing is preferably by three-dimensional inkjet printing.

The method of the present embodiments manufactures three-dimensional objects in a layerwise manner by forming a plurality of layers in a configured pattern corresponding to the shape of the objects.

Each layer is formed by an additive manufacturing apparatus which scans a two-dimensional surface and patterns it. While scanning, the apparatus visits a plurality of target locations on the two-dimensional layer or surface, and decides, for each target location or a group of target locations, whether or not the target location or group of target locations is to be occupied by building material, and which type of building material (e.g., a modeling material formulation or a support material formulation) is to be delivered thereto. The decision is made according to a computer image of the surface.

When the AM is by three-dimensional printing, an uncured building material, as defined herein, is dispensed from a dispensing head having a set of nozzles to deposit building material in layers on a supporting structure. The AM apparatus thus dispenses building material in target locations which are to be occupied and leaves other target locations void. The apparatus typically includes a plurality of dispensing heads, each of which can be configured to dispense a different building material. Thus, different target locations can be occupied by different building materials (e.g., a modeling formulation and/or a support formulation, as defined herein).

In some of any of the embodiments of this aspect of the present invention, the method begins by receiving 3D printing data corresponding to the shape of the object. The data can be received, for example, from a host computer which transmits digital data pertaining to fabrication instructions based on computer object data, e.g., in a form of a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD).

Next, droplets of the uncured building material as described herein are dispensed in layers, on a receiving medium, using at least two different multi-nozzle inkjet printing heads, according to the printing data. The receiving medium can be a tray of a three-dimensional inkjet system or a previously deposited layer. The uncured building material comprises a support material formulation as described herein for any of the respective embodiments and any combination thereof.

In some embodiments of the present invention, the dispensing is effected under ambient environment.

Optionally, before being dispensed, the uncured building material, or a part thereof (e.g., one or more formulations of the building material), is heated, prior to being dispensed. These embodiments are particularly useful for uncured building material formulations having relatively high viscosity at the operation temperature of the working chamber of a 3D inkjet printing system. The heating of the formulation(s) is preferably to a temperature that allows jetting the respective formulation through a nozzle of a printing head of a 3D inkjet printing system. In some embodiments of the present invention, the heating is to a temperature at which the respective formulation exhibits a viscosity of no more than X centipoises, where X is about 30 centipoises, preferably about 25 centipoises and more preferably about 20 centipoises, or 18 centipoises, or 16 centipoises, or 14 centipoises, or 12 centipoises, or 10 centipoises.

The heating can be executed before loading the respective formulation into the printing head of the 3D printing system, or while the formulation is in the printing head or while the composition passes through the nozzle of the printing head.

In some embodiments, the heating is executed before loading of the respective composition into the printing head, so as to avoid clogging of the printing head by the composition in case its viscosity is too high.

In some embodiments, the heating is executed by heating the printing heads, at least while passing the first and/or second composition through the nozzle of the printing head.

Once the uncured building material is dispensed on the receiving medium according to the 3D printing data, the method optionally and preferably continues by exposing the dispensed building material to conditions the effect curing. In some embodiments, the dispensed building material is exposed to curing energy by applying curing energy to the deposited layers. Preferably, the curing is applied to each individual layer following the deposition of the layer and prior to the deposition of the previous layer.

The curing energy or condition can be, for example, a radiation, such as an ultraviolet or visible irradiation, or other electromagnetic radiation, or electron beam radiation, depending on the building material used. The curing energy or condition applied to the dispensed layers serves for curing or solidifying or hardening the modeling material formulation and the support material formulation. Preferably, the same curing energy or condition is applied to effect curing of both the modeling materials and the support material. Alternatively, different curing energies or conditions are applied to the dispensed building material, simultaneously or sequentially, to effect curing of the modeling material formulation and the support material formulation.

According to some of any of the embodiments of this aspect of the present invention, once the building material is dispensed to form an object and curing energy or condition is applied, the cured support material is removed, to thereby obtain the final three-dimensional object.

According to some of any of the embodiments described herein, the support material is removed by contacting the cured support material with a cleaning composition as described in any of the respective embodiments described herein, and any combination thereof.

Contacting may be effected by means known in the art, for example, by immersing the object is water, and/or by jetting water onto the object. The contacting can be effected manually or in an automated manner. Any system or apparatus usable for removing a cured support material is contemplated.

In some of any of the embodiments described herein, removal of the support material does not include mechanical removal of the support material.

In some of any of the embodiments described herein, the contacting is effected for a time period that is in correlation with the amount of the cured support material in the printed object, and the geometry of the model object.

In some embodiments, the contacting is effected without replacing the cleaning composition (e.g., without introducing a fresh batch of a cleaning composition to the apparatus or system where removal of the cured support material is performed).

Any system suitable for AM of an object (e.g., a model object) is usable for executing the method as described herein.

A representative and non-limiting example of a system suitable for AM of an object according to some embodiments of the present invention comprises an additive manufacturing apparatus having a dispensing unit which comprises a plurality of dispensing heads. Each head preferably comprises an array of one or more nozzles, through which a liquid (uncured) building material is dispensed.

Preferably, but not obligatorily, the AM apparatus is a three-dimensional inkjet printing apparatus, in which case the dispensing heads are inkjet printing heads, and the building material is dispensed via inkjet technology. This need not necessarily be the case, since, for some applications, it may not be necessary for the additive manufacturing apparatus to employ three-dimensional printing techniques. Representative examples of additive manufacturing apparatus contemplated according to various exemplary embodiments of the present invention include, without limitation, binder jet powder based apparatus, fused deposition modeling apparatus and fused material deposition apparatus.

Each dispensing head is optionally and preferably fed via one or more building material reservoir(s) which may optionally include a temperature control unit (e.g., a temperature sensor and/or a heating device), and a material level sensor. To dispense the building material, a voltage signal is applied to the dispensing heads to selectively deposit droplets of material via the dispensing head nozzles, for example, as in piezoelectric inkjet printing technology. The dispensing rate of each head depends on the number of nozzles, the type of nozzles and the applied voltage signal rate (frequency). Such dispensing heads are known to those skilled in the art of solid freeform fabrication.

Optionally, but not obligatorily, the overall number of dispensing nozzles or nozzle arrays is selected such that half of the dispensing nozzles are designated to dispense support material formulations and half of the dispensing nozzles are designated to dispense modeling material formulations, i.e. the number of nozzles jetting modeling materials is the same as the number of nozzles jetting support material. Yet it is to be understood that it is not intended to limit the scope of the present invention and that the number of modeling material depositing heads (modeling heads) and the number of support material depositing heads (support heads) may differ. Generally, the number of modeling heads, the number of support heads and the number of nozzles in each respective head or head array are selected such as to provide a predetermined ratio, a, between the maximal dispensing rate of the support material and the maximal dispensing rate of modeling material. The value of the predetermined ratio, a, is preferably selected to ensure that in each formed layer, the height of modeling material equals the height of support material. Typical values for a are from about 0.6 to about 1.5.

For example, for a=1, the overall dispensing rate of support material formulation is generally the same as the overall dispensing rate of the modeling material formulation(s) when all modeling heads and support heads operate.

In a preferred embodiment, there are M modeling heads each having m arrays of p nozzles, and S support heads each having s arrays of q nozzles such that $M \times m \times p = S \times s \times q$. Each of the M×m modeling arrays and S×s support arrays can be manufactured as a separate physical unit, which can be assembled and disassembled from the group of arrays. In this embodiment, each such array optionally and preferably comprises a temperature control unit and a material level sensor of its own, and receives an individually controlled voltage for its operation.

The AM apparatus can further comprise a curing unit which can comprise one or more sources of a curing energy or a curing condition. The curing source can be, for example, a radiation source, such as an ultraviolet or visible or infrared lamp, or other sources of electromagnetic radiation, or electron beam source, depending on the modeling material formulation(s) being used. The curing energy source serves for curing or solidifying the building material formulation(s).

The dispensing head and curing energy source (e.g., radiation source) source are preferably mounted in a frame or block which is preferably operative to reciprocally move over a tray, which serves as the working surface (a receiving medium). In some embodiments of the present invention, the curing energy (e.g., radiation) sources are mounted in the block such that they follow in the wake of the dispensing heads to at least partially cure or solidify the materials just dispensed by the dispensing heads. According to the common conventions, the tray is positioned in the X-Y plane, and is preferably configured to move vertically (along the Z direction), typically downward. In various exemplary embodiments of the invention, the AM apparatus further comprises one or more leveling devices, e.g. a roller, which serve to straighten, level and/or establish a thickness of the newly formed layer prior to the formation of the successive layer thereon. The leveling device preferably comprises a waste collection device for collecting the excess material generated during leveling. The waste collection device may comprise any mechanism that delivers the material to a waste tank or waste cartridge.

In use, the dispensing heads as described herein move in a scanning direction, which is referred to herein as the X direction, and selectively dispense building material in a predetermined configuration in the course of their passage over the tray. The building material typically comprises one or more types of support material formulations and one or more types of modeling material formulations. The passage of the dispensing heads is followed by the curing of the modeling and support material formulation(s) by the source of curing energy or condition (e.g., radiation). In the reverse passage of the heads, back to their starting point for the layer just deposited, an additional dispensing of building material may be carried out, according to predetermined configuration. In the forward and/or reverse passages of the dispensing heads, the layer thus formed may be straightened by the leveling device, which preferably follows the path of the dispensing heads in their forward and/or reverse movement. Once the dispensing heads return to their starting point along the X direction, they may move to another position along an indexing direction, referred to herein as the Y direction, and continue to build the same layer by reciprocal movement along the X direction. Alternatively, the dispensing heads may move in the Y direction between forward and reverse movements or after more than one forward-reverse movement. The series of scans performed by the dispensing heads to complete a single layer is referred to herein as a single scan cycle.

Once the layer is completed, the tray is lowered in the Z direction to a predetermined Z level, according to the desired thickness of the layer subsequently to be printed. The procedure is repeated to form a three-dimensional object which comprises a modeling material and a support material in a layerwise manner.

In some embodiments, the tray may be displaced in the Z direction between forward and reverse passages of the dispensing head, within the layer. Such Z displacement is carried out in order to cause contact of the leveling device with the surface in one direction and prevent contact in the other direction.

The system for performing the method as described herein optionally and preferably comprises a building material supply apparatus which comprises the building material containers or cartridges and supplies a plurality of building material formulations (modeling material formulation(s) and a support material formulation as described herein to the fabrication apparatus.

The system may further comprise a control unit which controls the fabrication apparatus and optionally and preferably also the supply apparatus as described herein. The control unit preferably communicates with a data processor which transmits digital data pertaining to fabrication instructions based on computer object data, stored on a computer readable medium, preferably a non-transitory medium, in a form of a Standard Tessellation Language (STL) format or any other format such as, but not limited to, the aforementioned formats. Typically, the control unit controls the voltage applied to each dispensing head or nozzle array and the temperature of the building material in the respective printing head.

Once the manufacturing data is loaded to the control unit, it can operate without user intervention. In some embodiments, the control unit receives additional input from the operator, e.g., using a data processor or using a user interface communicating with the control unit. The user interface can be of any type known in the art, such as, but not limited to, a keyboard, a touch screen and the like. For example, the control unit can receive, as additional input, one or more building material types and/or attributes, such as, but not limited to, color, characteristic distortion and/or transition temperature, viscosity, electrical property, magnetic property. Other attributes and groups of attributes are also contemplated.

Further details on the principles and operations of an AM system such as described herein is found in U.S. Patent Application having Publication No. 2013/0073068, the contents of which are hereby incorporated by reference.

According to some embodiments of each of the methods and systems described herein, the uncured building material comprises at least one support material formulation as described herein.

The Model Object:

According to an aspect of some embodiments of the present invention, there is provided a three-dimension model object prepared by the method as described herein, in any of the embodiments thereof and any combination thereof.

According to an aspect of some embodiments of the present invention there is provided a 3D model object, fabricated by an AM method as described herein.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof. Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Herein throughout, the phrase "linking moiety" or "linking group" describes a group that connects two or more moieties or groups in a compound. A linking moiety is typically derived from a bi- or tri-functional compound, and can be regarded as a bi- or tri-radical moiety, which is connected to two or three other moieties, via two or three atoms thereof, respectively.

Exemplary linking moieties include a hydrocarbon moiety or chain, optionally interrupted by one or more heteroatoms, as defined herein, and/or any of the chemical groups listed below, when defined as linking groups.

When a chemical group is referred to herein as "end group" it is to be interpreted as a substituent, which is connected to another group via one atom thereof.

Herein throughout, the term "hydrocarbon" collectively describes a chemical group composed mainly of carbon and hydrogen atoms. A hydrocarbon can be comprised of alkyl, alkene, alkyne, aryl, and/or cycloalkyl, each can be substituted or unsubstituted, and can be interrupted by one or more heteroatoms. The number of carbon atoms can range from 2 to 20, and is preferably lower, e.g., from 1 to 10, or from 1 to 6, or from 1 to 4. A hydrocarbon can be a linking group or an end group. As used herein, the term "amine" describes both a —NRxRy group and a —NRx- group, wherein Rx and Ry are each independently hydrogen, alkyl, cycloalkyl, aryl, as these terms are defined hereinbelow.

The amine group can therefore be a primary amine, where both Rx and Ry are hydrogen, a secondary amine, where Rx is hydrogen and Ry is alkyl, cycloalkyl or aryl, or a tertiary amine, where each of Rx and Ry is independently alkyl, cycloalkyl or aryl.

Alternatively, Rx and Ry can each independently be hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, carbonyl, C-carboxylate, O-carboxylate, N-thiocarbamate, O-thiocarbamate, urea, thiourea, N-carbamate, O-carbamate, C-amide, N-amide, guanyl, guanidine and hydrazine.

The term "amine" is used herein to describe a —NRxRy group in cases where the amine is an end group, as defined herein under, and is used herein to describe a —NRx-group in cases where the amine is a linking group or is or part of a linking moiety.

The term "alkyl" describes a saturated aliphatic hydrocarbon including straight chain and branched chain groups. Preferably, the alkyl group has 1 to 20 carbon atoms. Whenever a numerical range; e.g., "1-20", is stated herein, it implies that the group, in this case the alkyl group, may contain 1 carbon atom, 2 carbon atoms, 3 carbon atoms, etc., up to and including 20 carbon atoms. More preferably, the alkyl is a medium size alkyl having 1 to 10 carbon atoms. Most preferably, unless otherwise indicated, the alkyl is a lower alkyl having 1 to 4 carbon atoms (C(1-4) alkyl). The alkyl group may be substituted or unsubstituted. Substituted alkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine.

The alkyl group can be an end group, as this phrase is defined hereinabove, wherein it is attached to a single adjacent atom, or a linking group, as this phrase is defined hereinabove, which connects two or more moieties via at least two carbons in its chain. When the alkyl is a linking group, it is also referred to herein as "alkylene" or "alkylene chain".

Alkene and alkyne, as used herein, are an alkyl, as defined herein, which contains one or more double bond or triple bond, respectively.

The term "cycloalkyl" describes an all-carbon monocyclic ring or fused rings (i.e., rings which share an adjacent pair of carbon atoms) group where one or more of the rings does not have a completely conjugated pi-electron system. Examples include, without limitation, cyclohexane, adamantine, norbornyl, isobornyl, and the like. The cycloalkyl group may be substituted or unsubstituted. Substituted cycloalkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The cycloalkyl group can be an end group, as this phrase is defined hereinabove, wherein it is attached to a single adjacent atom, or a linking group, as this phrase is defined hereinabove, connecting two or more moieties at two or more positions thereof.

The term "heteroalicyclic" describes a monocyclic or fused ring group having in the ring(s) one or more atoms such as nitrogen, oxygen and sulfur. The rings may also have one or more double bonds. However, the rings do not have a completely conjugated pi-electron system. Representative examples are piperidine, piperazine, tetrahydrofuran, tetrahydropyrane, morpholino, oxalidine, and the like. The heteroalicyclic may be substituted or unsubstituted. Substituted heteroalicyclic may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroalicyclic group can be an end group, as this phrase is defined hereinabove, where it is attached to a single adjacent atom, or a linking group, as this phrase is defined hereinabove, connecting two or more moieties at two or more positions thereof.

The term "aryl" describes an all-carbon monocyclic or fused-ring polycyclic (i.e., rings which share adjacent pairs of carbon atoms) groups having a completely conjugated pi-electron system. The aryl group may be substituted or unsubstituted. Substituted aryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The aryl group can be an end group, as this term is defined hereinabove, wherein it is attached to a single adjacent atom, or a linking group, as this term is defined hereinabove, connecting two or more moieties at two or more positions thereof.

The term "heteroaryl" describes a monocyclic or fused ring (i.e., rings which share an adjacent pair of atoms) group having in the ring(s) one or more atoms, such as, for example, nitrogen, oxygen and sulfur and, in addition, having a completely conjugated pi-electron system. Examples, without limitation, of heteroaryl groups include pyrrole, furan, thiophene, imidazole, oxazole, thiazole, pyrazole, pyridine, pyrimidine, quinoline, isoquinoline and purine. The heteroaryl group may be substituted or unsubstituted. Substituted heteroaryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroaryl group can be an end group, as this phrase is defined hereinabove, where it is attached to a single adjacent atom, or a linking group, as this phrase is defined hereinabove, connecting two or more moieties at two or more positions thereof. Representative examples are pyridine, pyrrole, oxazole, indole, purine and the like.

The term "halide" and "halo" describes fluorine, chlorine, bromine or iodine.

The term "haloalkyl" describes an alkyl group as defined above, further substituted by one or more halide.

The term "sulfate" describes a —O—S(=O)$_2$—ORx end group, as this term is defined hereinabove, or an —O—S(=O)$_2$—O— linking group, as these phrases are defined hereinabove, where Rx is as defined hereinabove.

The term "thiosulfate" describes a —O—S(=S)(=O)—ORx end group or a —O—S(=S)(=O)—O— linking group, as these phrases are defined hereinabove, where Rx is as defined hereinabove.

The term "sulfite" describes an —O—S(=O)—O—Rx end group or a —O—S(=O)—O— group linking group, as these phrases are defined hereinabove, where Rx' is as defined hereinabove.

The term "thiosulfite" describes a —O—S(=S)—O—Rx end group or an —O—S(=S)—O— group linking group, as these phrases are defined hereinabove, where Rx is as defined hereinabove.

The term "sulfinate" describes a —S(=O)—ORx end group or an —S(=O)—O— group linking group, as these phrases are defined hereinabove, where Rx is as defined hereinabove.

The term "sulfoxide" or "sulfinyl" describes a —S(=O)Rx end group or an —S(=O)— linking group, as these phrases are defined hereinabove, where Rx is as defined hereinabove.

The term "sulfonate" describes a —S(=O)$_2$—Rx end group or an —S(=O)$_2$— linking group, as these phrases are defined hereinabove, where Rx is as defined herein.

The term "S-sulfonamide" describes a —S(=O)$_2$—NRxRy end group or a —S(=O)$_2$—NRx- linking group, as these phrases are defined hereinabove, with Rx and Ry as defined herein.

The term "N-sulfonamide" describes an RxS(=O)$_2$—NRy- end group or a —S(=O)$_2$-NRx- linking group, as these phrases are defined hereinabove, where Rx and Ry are as defined herein.

The term "disulfide" refers to a —S—SRx end group or a —S—S— linking group, as these phrases are defined hereinabove, where Rx is as defined herein.

The term "phosphonate" describes a —P(=O)(ORx)(ORy) end group or a —P(=O)(ORx)(O)— linking group, as these phrases are defined hereinabove, with Rx and Ry as defined herein.

The term "thiophosphonate" describes a —P(=S)(ORx)(ORy) end group or a —P(=S)(ORx)(O)— linking group, as these phrases are defined hereinabove, with Rx and Ry as defined herein.

The term "phosphinyl" describes a —PRxRy end group or a —PRx- linking group, as these phrases are defined hereinabove, with Rx and Ry as defined hereinabove.

The term "phosphine oxide" describes a —P(=O)(Rx)(Ry) end group or a —P(=O)(Rx)- linking group, as these phrases are defined hereinabove, with Rx and Ry as defined herein.

The term "phosphine sulfide" describes a —P(=S)(Rx)(Ry) end group or a —P(=S)(Rx)- linking group, as these phrases are defined hereinabove, with Rx and Ry as defined herein.

The term "phosphite" describes an —O—PRx(=O)(ORy) end group or an —O—PRx(=O)(O)— linking group, as these phrases are defined hereinabove, with Rx and Ry as defined herein.

The term "carbonyl" or "carbonate" as used herein, describes a —C(=O)—Rx end group or a —C(=O)— linking group, as these phrases are defined hereinabove, with Rx as defined herein.

The term "thiocarbonyl" as used herein, describes a —C(=S)—Rx end group or a —C(=S)— linking group, as these phrases are defined hereinabove, with Rx as defined herein.

The term "oxo" as used herein, describes a (=O) group, wherein an oxygen atom is linked by a double bond to the atom (e.g., carbon atom) at the indicated position.

The term "thiooxo" as used herein, describes a (=S) group, wherein a sulfur atom is linked by a double bond to the atom (e.g., carbon atom) at the indicated position.

The term "oxime" describes a =N—OH end group or a =N—O— linking group, as these phrases are defined hereinabove.

The term "hydroxyl" describes a —OH group.

The term "alkoxy" describes both an —O-alkyl and an —O-cycloalkyl group, as defined herein.

The term "aryloxy" describes both an —O-aryl and an —O-heteroaryl group, as defined herein.

The term "thiohydroxy" describes a —SH group.

The term "thioalkoxy" describes both a —S-alkyl group, and a —S-cycloalkyl group, as defined herein.

The term "thioaryloxy" describes both a —S-aryl and a —S-heteroaryl group, as defined herein.

The "hydroxyalkyl" is also referred to herein as "alcohol", and describes an alkyl, as defined herein, substituted by a hydroxy group.

The term "cyano" describes a —C≡N group.

The term "isocyanate" describes an —N=C=O group.

The term "isothiocyanate" describes an —N=C=S group.

The term "nitro" describes an —NO$_2$ group.

The term "acyl halide" describes a —(C=O)Rz group wherein Rz is halide, as defined hereinabove.

The term "azo" or "diazo" describes an —N=Rx end group or an —N=N— linking group, as these phrases are defined hereinabove, with Rx as defined hereinabove.

The term "peroxo" describes an —O—ORx end group or an —O—O— linking group, as these phrases are defined hereinabove, with Rx as defined hereinabove.

The term "carboxylate" as used herein encompasses C-carboxylate and O-carboxylate.

The term "C-carboxylate" describes a —C(=O)—ORx end group or a —C(=O)—O— linking group, as these phrases are defined hereinabove, where Rx is as defined herein.

The term "O-carboxylate" describes a —OC(=O)Rx end group or a —OC(=O)— linking group, as these phrases are defined hereinabove, where Rx is as defined herein.

A carboxylate can be linear or cyclic. When cyclic, Rx and the carbon atom are linked together to form a ring, in C-carboxylate, and this group is also referred to as lactone. Alternatively, Rx and O are linked together to form a ring in O-carboxylate. Cyclic carboxylates can function as a linking group, for example, when an atom in the formed ring is linked to another group.

The term "thiocarboxylate" as used herein encompasses C-thiocarboxylate and O-thiocarboxylate.

The term "C-thiocarboxylate" describes a —C(=S)—ORx end group or a —C(=S)—O— linking group, as these phrases are defined hereinabove, where Rx is as defined herein.

The term "O-thiocarboxylate" describes a —OC(=S)Rx end group or a —OC(=S)— linking group, as these phrases are defined hereinabove, where Rx is as defined herein.

A thiocarboxylate can be linear or cyclic. When cyclic, Rx and the carbon atom are linked together to form a ring, in C-thiocarboxylate, and this group is also referred to as thiolactone. Alternatively, Rx and O are linked together to form a ring in O-thiocarboxylate. Cyclic thiocarboxylates can function as a linking group, for example, when an atom in the formed ring is linked to another group.

The term "carbamate" as used herein encompasses N-carbamate and O-carbamate.

The term "N-carbamate" describes an RyOC(=O)—NRx- end group or a —OC(=O)—NRx- linking group, as these phrases are defined hereinabove, with Rx and Ry as defined herein.

The term "O-carbamate" describes an —OC(=O)—NRxRy end group or an —OC(=O)—NRx- linking group, as these phrases are defined hereinabove, with Rx and Ry as defined herein.

A carbamate can be linear or cyclic. When cyclic, Rx and the carbon atom are linked together to form a ring, in O-carbamate. Alternatively, Rx and O are linked together to form a ring in N-carbamate. Cyclic carbamates can function as a linking group, for example, when an atom in the formed ring is linked to another group.

The term "carbamate" as used herein encompasses N-carbamate and O-carbamate.

The term "thiocarbamate" as used herein encompasses N-thiocarbamate and O-thiocarbamate.

The term "O-thiocarbamate" describes a —OC(=S)—NRxRy end group or a —OC(=S)—NRx- linking group, as these phrases are defined hereinabove, with Rx and Ry as defined herein.

The term "N-thiocarbamate" describes an RyOC(=S) NRx- end group or a —OC(=S)NRx- linking group, as these phrases are defined hereinabove, with Rx and Ry as defined herein.

Thiocarbamates can be linear or cyclic, as described herein for carbamates.

The term "dithiocarbamate" as used herein encompasses S-dithiocarbamate and N-dithiocarbamate.

The term "S-dithiocarbamate" describes a —SC(=S)—NRxRy end group or a —SC(=S)NRx- linking group, as these phrases are defined hereinabove, with Rx and Ry as defined herein.

The term "N-dithiocarbamate" describes an RySC(=S) NRx- end group or a —SC(=S)NRx- linking group, as these phrases are defined hereinabove, with Rx and Ry as defined herein.

The term "urea", which is also referred to herein as "ureido", describes a —NRxC(=O)—NRyRq end group or a —NRxC(=O)—NRy- linking group, as these phrases are defined hereinabove, where Rz and Ry are as defined herein and Rq is as defined herein for Rx and Ry.

The term "thiourea", which is also referred to herein as "thioureido", describes a —NRx-C(=S)—NRyRq end group or a —NRx-C(=S)—NRy- linking group, with Rx, Ry and Rq as defined herein.

The term "amide" as used herein encompasses C-amide and N-amide.

The term "C-amide" describes a —C(=O)—NRxRy end group or a —C(=O)—NRx- linking group, as these phrases are defined hereinabove, where Rx and Ry are as defined herein.

The term "N-amide" describes a RxC(=O)—NRy- end group or a RxC(=O)—N— linking group, as these phrases are defined hereinabove, where Rx and Ry are as defined herein.

An amide can be linear or cyclic. When cyclic, Rx and the carbon atom are linked together to form a ring, in C-amide, and this group is also referred to as lactam. Cyclic amides can function as a linking group, for example, when an atom in the formed ring is linked to another group.

The term "guanyl" describes a RxRyNC(=N)— end group or a —RxNC(=N)— linking group, as these phrases are defined hereinabove, where Rx and Ry are as defined herein.

The term "guanidine" describes a -RxNC(=N)—NRyRq end group or a —RxNC(=N)— NRy- linking group, as these phrases are defined hereinabove, where Rx, Ry and Rq are as defined herein.

The term "hydrazine" describes a —NRx-NRyRq end group or a —NRx-NRy- linking group, as these phrases are defined hereinabove, with Rx, Ry, and Rq as defined herein.

As used herein, the term "hydrazide" describes a —C(=O)—NRx-NRyRq end group or a —C(=O)—NRx-NRy- linking group, as these phrases are defined hereinabove, where Rx, Ry and Rq are as defined herein.

As used herein, the term "thiohydrazide" describes a —C(=S)—NRx-NRyRq end group or a —C(=S)—NRx-NRy- linking group, as these phrases are defined hereinabove, where Rx, Ry and Rq are as defined herein.

As used herein, the term "alkylene glycol" describes a —O—[(CRxRu)$_z$—O]$_y$—Rq end group or a —O—[(CRxRy)$_z$-O]$_y$— linking group, with Rx, Ry and Rq being as defined herein, and with z being an integer of from 1 to 10, preferably, 2-6, more preferably 2 or 3, and y being an integer of 1 or more. Preferably Rx and Ry are both hydrogen. When z is 2 and y is 1, this group is ethylene glycol. When z is 3 and y is 1, this group is propylene glycol.

When y is greater than 4, the alkylene glycol is referred to herein as poly(alkylene glycol). In some embodiments of the present invention, a poly(alkylene glycol) group or moiety can have from 10 to 200 repeating alkylene glycol units, such that z is 10 to 200, preferably 10-100, more preferably 10-50.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Examples 1

The present inventor has searched for a cleaning solution that efficiently removes a cured support material from a printed object made of a cured support material and a cured modeling material. More particularly, the present inventor has searched for a cleaning solution that can efficiently dissolve cured support materials which are not soluble in water but require concentrated alkaline solutions (e.g., of alkali metal hydroxides such as NaOH or KOH) for dissolving the cured support material at a reasonable dissolution time. Exemplary such cured support materials are those that exhibit at least some degree of cross-linking of the polymeric chains formed upon curing, for example, cross-linked polyacrylates and/or cross-linked polymethacrylates.

While it is known that for increased dissolution rate and hence decreased dissolution time, a higher concentration of the alkali metal hydroxide can be used, it has also been recognized that such highly concentrated solutions are corrosive and hazardous and hence their use is undesirable. It has further been recognized that solutions of alkali metal hydroxides, when used to dissolve, for example, cross-linked polyacrylates, or any other hydrolysable esters or amides, participate in the hydrolysis reaction of the ester and/or amide bonds present in the cross-linked polymers in a stochiometric manner, and therefore reach saturation relatively fast and should be replaced repeatedly, as the concentration of dissolved support material in the solution increases. For example, when using 5% NaOH solution, the dissolution rate increases by 2-folds already when the solution contains 5% by weight of dissolved support material.

Reference is made, for example, to FIG. 1, where it is shown that there is a linear increase in the dissolution time as a function of the load of the support material in the solution, which is indicative of the saturation. In the exemplary experiment shown in FIG. 1, the slope for a 5% NaOH is 20.4.

Upon extensive studies conducted with solutions of various alkaline substances, including various commercially available detergents, organic alkaline substances, various concentrations of NaOH and KOH, and various combinations of metal alkali with surface active agents, the present inventor has uncovered that an alkaline solution which is a combination of two alkaline substances, sodium hydroxide and sodium metasilicate, each at a concentration of 1-3% by weight, and at a total concentration of the alkaline substances being no more that 4% weight, provided a dissolution time that is similar to the commonly used 5% NaOH solution at 0% load of the support material, and a much lower dissolution time at elevated support loadings.

The sodium metasilicate, as well as other alkali metal silicates, exhibits a buffering capacity at very high pH (e.g., pH>11). Along with sodium hydroxide, sodium metasilicate buffering capacity is increased to even higher pH (pH>14) and therefore in its presence, a constant pH (hydroxide ions concentration) is maintained during the support material dissolution. This enables both a longer "life-time" of the cleaning solution, namely, the cleaning solution remains active even at high concentrations of dissolved support material (support loading or support load), and the dissolution rate remains substantially constant, and, because of the reduced concentration of NaOH compared to the otherwise commonly used 5% NaOH solution, safety concerns are minor.

The present inventor has further studied the optimal concentrations of each of the alkaline substances in the solution, and the optimal ratio between the alkaline substances, and has uncovered that a best performance, i.e., high and constant dissolution rate, is achieved with a solution containing 2% wt. NaOH and 1% wt.
sodium metasilicate (the remaining of the solution being water).

FIG. 1 presents comparative plots showing normalized cleaning time (dissolution time), which is the cleaning time at a certain concentration of dissolved support material in the solution, divided by the cleaning time of the same object in a fresh solution (containing 0% of dissolved support material, which is referred to as 100%) as a function of the concentration of dissolved support material in the solution (support loading), as determined for a cured support material made of a support material formulation that comprises a mixture of monoacrylates and diacrylates and hence exhibits some degree of cross-linking. The data is presented for a cleaning solution containing 5% NaOH (blue diamonds) and an exemplary solution of NaOH and sodium metasilicate as described herein (red squares).

In brief, assays were conducted, for each solution, with identical printed objects comprising a cured modeling material and a cured support material. Each printed object was weighed before and after dissolution of the support material, and the amount of dissolved support material introduced to the solution upon its dissolution was calculated (for example, 100 grams support per printed object).

Two cleaning solutions were prepared: 5% wt. NaOH and 2% wt. NaOH+1% wt. $Na_2SiO_3$. One printed object was immersed in each solution until complete dissolution of support, and the cleaning time (dissolution time) was recorded (for example, 1 hour). This recorded dissolution time served as a reference time (the 100% value), which takes to dissolve a certain amount of a cured support material of a certain geometry in a fresh solution.

Next, an additional identical printed object was immersed in the same solution, already containing, for example, 100 grams of dissolved support material, and the dissolution time was recorded (for example, 1.5 hour). The normalized cleaning time for this printed object was the recorded cleaning time divided by the reference time in fresh solution, i.e. 1.5 hour/1 hour=150%, and so forth, for each subsequent printed object.

As shown in FIG. 1, the cleaning time increases constantly since there are less and less hydroxide ions available for ester bond cleavage (hydroxide ions depletion). For the 5% NaOH solution, a drastic increase in the normalized cleaning time is observed, indicative of the saturation of the cleaning solution, with the slope of the graph being 20.4

However, since the sodium silicate solution acts as a buffer, the concentration of hydroxide ions is maintained constant, and thus, for the $NaOH/Na_2SiO_3$ solution, the cleaning time is less affected by the amount of dissolved support material, and the change in the dissolution time is substantially lower. The slope of the respective graph is 2.7 (almost 10-folds lower compared to the 5% NaOH solution).

This enables longer "life-time" of the cleaning solution (requires less replacements of solution to achieve the same cleaning time).

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A cleaning composition usable in removing a cured support material from a printed object obtained by additive manufacturing, the composition being an aqueous solution and consisting of an alkali metal hydroxide, an alkali metal silicate and water, wherein a total concentration of the alkali metal hydroxide and the alkali metal silicate is lower than 4 weight percent, of the total weight of the composition, and wherein a weight ratio of said alkali metal hydroxide to said alkali metal silicate is 2:1.

2. The composition of claim 1, wherein said alkali metal hydroxide is sodium hydroxide.

3. The composition of claim 1, wherein said alkali metal silicate is sodium metasilicate.

4. The composition of claim 3, wherein said alkali metal silicate is sodium metasilicate.

5. The composition of claim 1, wherein a concentration of said alkali metal silicate is lower than 3 weight percent, of the total weight of the composition.

6. The composition of claim 1, wherein a concentration of said alkali metal hydroxide ranges from 1 to 3 weight percent of the total weight of the composition.

7. The composition of claim 1, wherein a concentration of said alkali metal silicate ranges from 1 to 3 weight percent of the total weight of the composition.

8. The composition of claim 6, wherein a concentration of said alkali metal silicate ranges from 1 to 3 weight percent of the total weight of the composition.

9. The composition of claim 1, wherein a concentration of said alkali metal hydroxide ranges from 1 to 3 weight percent of the total weight of the composition, and a concentration of said alkali metal silicate ranges from 1 to 3 weight percent of the total weight of the composition.

10. The composition of claim 1, wherein a concentration of said alkali metal hydroxide is 2 weight percent of the total weight of the composition.

11. The composition of claim 1, wherein a concentration of said alkali metal silicate is 1 weight percent of the total weight of the composition.

12. The composition of claim 10, wherein a concentration of said alkali metal silicate is 1 weight percent of the total weight of the composition.

13. The composition of claim 1, wherein a dissolution time of a cured support material in a printed object, upon contacting the printed object with the cleaning composition, is substantially the same as, or lower than, a dissolution time of said cured support material in said printed object, upon contacting said printed object with an aqueous solution containing 5 weight percent NaOH.

14. The composition of claim 1, wherein a dissolution time of a cured support material in a printed object, upon contacting the printed object with the cleaning composition, increases by no more than 50% when at least 5 weight percent of dissolved support material, or at least 10 percent of dissolved support material, or at least 20 percent of dissolved support material is present in the cleaning composition.

15. A method of fabricating a three-dimensional model object, the method comprising:
dispensing a building material so as to sequentially form a plurality of layers in a configured pattern corresponding to the shape of the object, wherein said building material comprises a modeling material formulation and a support material formulation;
subsequent to said dispensing, exposing the building material to curing energy, to thereby obtain a printed object comprised of a cured modeling material and a cured support material; and
contacting the printed object with a cleaning composition according to claim 1, to thereby remove said cured support material from said cured modeling material,
thereby obtaining the three-dimensional model object.

16. The method of claim 15, wherein said cured support material comprises cross-linked polymeric chains.

* * * * *